(12) United States Patent
Jung (10) Patent No.: US 6,204,105 B1
(45) Date of Patent: Mar. 20, 2001

(54) METHOD FOR FABRICATING A POLYCIDE SEMICONDUCTOR DEVICE

(75) Inventor: Jong Wan Jung, Daejeon-si (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 08/874,720

(22) Filed: Jun. 13, 1997

(30) Foreign Application Priority Data

Mar. 17, 1997 (KR) ................................ 8972/1997

(51) Int. Cl.⁷ ................................ H01L 21/8234
(52) U.S. Cl. ................ 438/238; 438/253; 438/381; 438/382; 438/592; 438/393; 438/396; 438/250; 438/239
(58) Field of Search ................ 438/238, 592, 438/381, 253, 382, 393, 396, 250, 239

(56) References Cited

U.S. PATENT DOCUMENTS

| | | | |
|---|---|---|---|
| 5,107,322 | * 4/1992 | Kimura | 257/528 |
| 5,356,826 | * 10/1994 | Natsume | 438/238 |
| 5,391,906 | * 2/1995 | Natsume | 257/379 |
| 5,470,775 | * 11/1995 | Nariani | 438/238 |
| 5,472,892 | * 12/1995 | Gwen et al. | 438/592 |
| 5,597,759 | * 1/1997 | Yoshimori | 438/396 |
| 5,618,749 | * 4/1997 | Takahashi et al. | 438/238 |
| 5,701,025 | * 12/1997 | Yoshimori | 257/379 |
| 5,723,352 | * 3/1998 | Shih et al. | 438/592 |
| 5,924,011 | * 7/1999 | Huang | 438/239 |

* cited by examiner

Primary Examiner—John F. Niebling
Assistant Examiner—Lynne A. Gurley
(74) Attorney, Agent, or Firm—Morgan, Lewis & Bockius LLP (57) ABSTRACT

A method for fabricating a semiconductor device includes the steps of forming a field oxide layer on a field region of a semiconductor substrate where a field region and an active region are defined, forming a polycide layer on the entire surface of the semiconductor substrate including the field oxide layer and selectively removing the polycide layer to form a gate electrode and a lower electrode of a capacitor, successively forming a dielectric layer and a polysilicon layer on the entire surface including the lower electrode of the capacitor and patterning the dielectric layer and the lower electrode to form an upper electrode pattern and a resistor pattern, and forming an insulating layer to cover the resistor pattern and forming another polycide layer on the upper electrode of the capacitor.

15 Claims, 7 Drawing Sheets

METHOD FOR FABRICATING A POLYCIDE SEMICONDUCTOR DEVICE

BACKGROUND OF THE INVENTION

1. Field of the Invention

The present invention relates to a semiconductor device and, more particularly, to a method for fabricating a semiconductor device, in which, when a MOSFET, a capacitor, and a resistor which are elements for an analog integrated circuit (IC) are fabricated using a polycide and salicide process, electrodes of a capacitor are formed of polycide to minimize a resistance of the electrodes and to give a symmetry to the electrode, thus advancing the performance of the device.

2. Discussion of the Related Art

A conventional method for fabricating a semiconductor device will be described below with reference to the accompanying drawings.

FIGS. 1a to 1d are cross-sectional views showing process steps of a method for fabricating a semiconductor device.

Figure 1A:
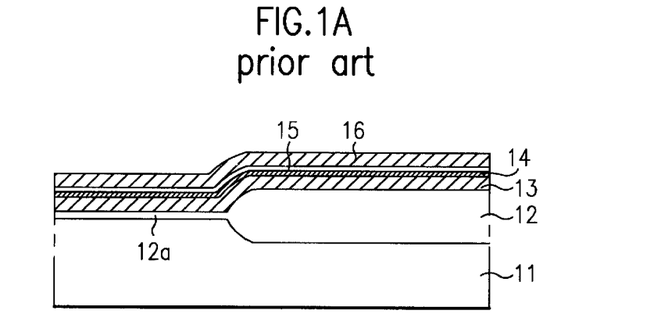
FIGS. 1a to 1d are cross-sectional views showing process steps of a conventional method for fabricating a semiconductor device.

Referring initially to FIG. 1a, a field oxide layers 12 is formed on a predetermined area of a semiconductor device 11 to define an active region. Subsequently, a gate insulating layer 12a is grown on the entire surface of the semiconductor substrate 11 including the field oxide layer 12. A polysilicon layer 13, which is used as a lower electrode of a capacitor, is formed on the gate insulating layer 12a including the field oxide layer 12 and then a metal layer is formed thereon. Next, an annealing process is performed to form a polycide layer 14 at interface of the polysilicon layer and the metal layer. Subsequently, a dielectric layer 15 and a polysilicon layer 16, which is used as an upper electrode of the capacitor, are successively formed on the polycide layer 14.

Figure 1B:
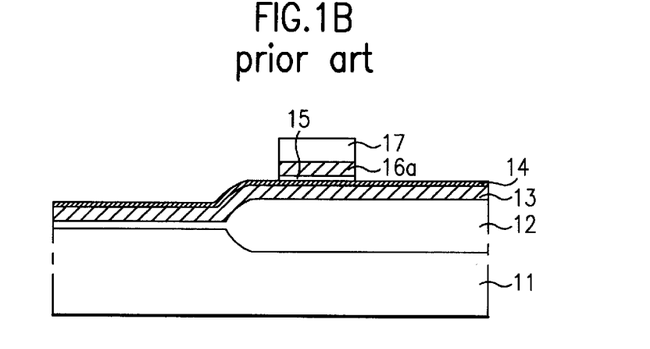

Referring to FIG. 1b, a first photo resist film 17 is formed on the polysilicon layer 16 and then patterned by an exposure and to development process. Using the photo resist pattern 17 as a mask, the polysilicon layer 16 and the dielectric layer 15 are selectively removed by an etching process to form an upper electrode 16a of the capacitor.

Figure 1C:
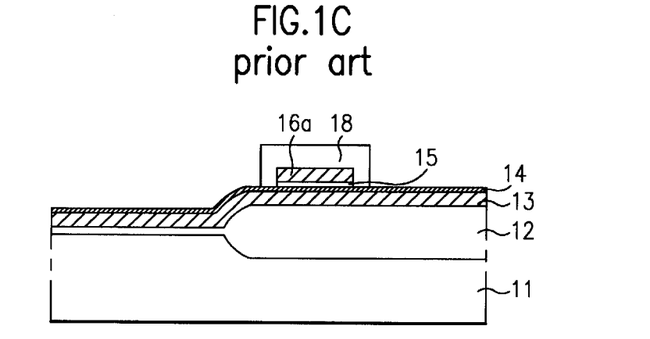

Referring to FIG. 1c, the remaining photo resist film 17 is removed, and then a second photo resist film 18 is coated on the polysilicon layer including the upper electrode 16a and patterned by an exposure and development process so that the second photo resist film is remained enough to cover the dielectric layer 15 and the upper electrode 16a.

Figure 1D:
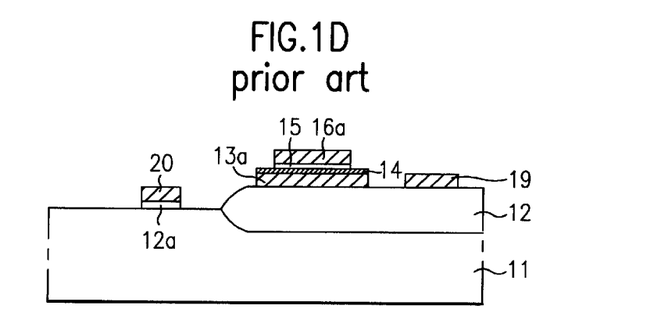

Referring to FIG. 1d, using the second photo resist pattern 18 as a mask, the polycide layer 14 and the polysilicon layer 13 are successively removed to form a lower electrode 13a. Next, a polysilicon for a resistor pattern is formed on the semiconductor substrate 11 including the upper electrode 16a of the capacitor and then is selectively removed to form a resistor pattern 19 made of polysilicon on a predetermined area of the field oxide layer 12. A gate electrode 20 is formed on the semiconductor substrate 11 of the active region. Accordingly, there are formed the lower electrode made of polycide and the upper electrode made of polysilicon. And the gate electrode and the resistor pattern 19 are made of polysilicon.

The conventional method for fabricating a semiconductor device has the following problems.

First, a MOSFET, a capacitor, and a resistor, which are elements constituting an analog IC, are formed by respective processes and therefore the overall process is complex.

Second, since the material of a resistor used as a resistance and the material of electrodes of a capacitor are all made of polysilicon, the resistance of the electrode of a capacitor is increased, thereby increasing the delay of signals and power loss.

SUMMARY OF THE INVENTION

Therefore, the present invention is directed to a method for fabricating a semiconductor device that substantially obviates one or more of problems due to limitations and disadvantages of the related art.

An object of the invention is to provide a method for fabricating a semiconductor device suitable for a super high speed IC by minimizing a resistance of a capacitor by forming electrodes of a capacitor with silicide-polycide and a resistor with polysilicon.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of forming a field oxide layer on a field region of a semiconductor substrate where a field region and an active region are defined, forming a polycide layer on the entire surface of the semiconductor substrate including the field oxide layer and selectively removing the polycide layer to form a gate electrode and a lower electrode of a capacitor, successively forming a dielectric layer and a polysilicon layer on the entire surface including the lower electrode of the capacitor and patterning the dielectric layer and the lower electrode to form an upper electrode pattern and a resistor pattern, and forming an insulating layer around the resistor pattern and forming a polycide layer on the upper electrode of the capacitor.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

FIGS. 2a to 2i are cross-sectional views showing process steps of a method for fabricating a semiconductor device according to the first embodiment of the invention.

Figure 2A:
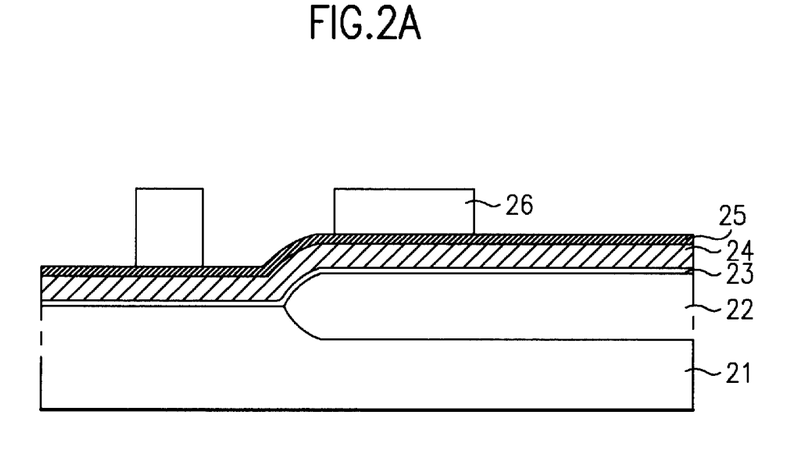
FIGS. 2a to 2i are cross-sectional views showing process steps of a method for fabricating a semiconductor device according to a first embodiment of the invention.

Referring initially to FIG. 2a, there is formed a field oxide layer 22 on a predetermined area of a semiconductor substrate 21 to define an active region. Subsequently, on the entire surface of the semiconductor substrate 21 including the field oxide layer 22, there is formed a first insulating layer 23, upon which a first polysilicon layer 24 then is formed. At this time, the first insulating layer 23 is used as a gate insulating layer. A metal is deposited on the first polysilicon layer 24 and annealed to form a polycide layer 25 at interface of the first polysilicon layer 24 and the metal. Next, a first photo resist film 26 is coated on the polycide layer 25 and patterned by an exposure and development process.

Figure 2B:
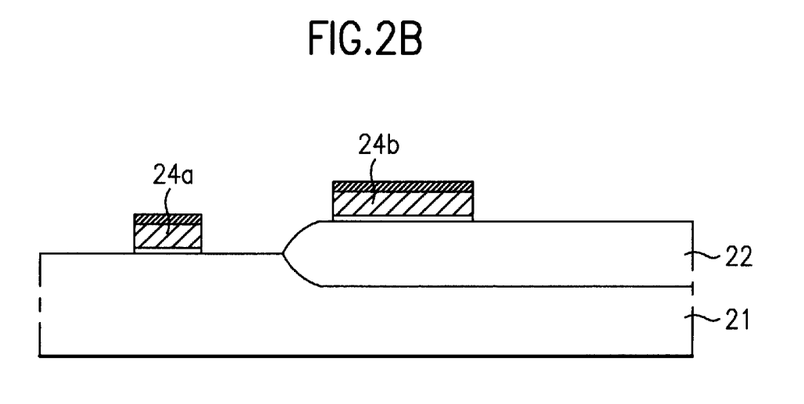

Referring to FIG. 2b, using the photo resist pattern 26 as a mask, the polycide layer 25, the first polysilicon layer 24, and the first insulating layer 23 are selectively removed by an etching process. As a result, there are formed a gate electrode 24a made of polycide, that is, polysilicon and silicide on the semiconductor substrate 21 of the active region, and a lower electrode 24b of a capacitor made of polycide on a predetermined area of the field oxide layer 22.

Figure 2C:
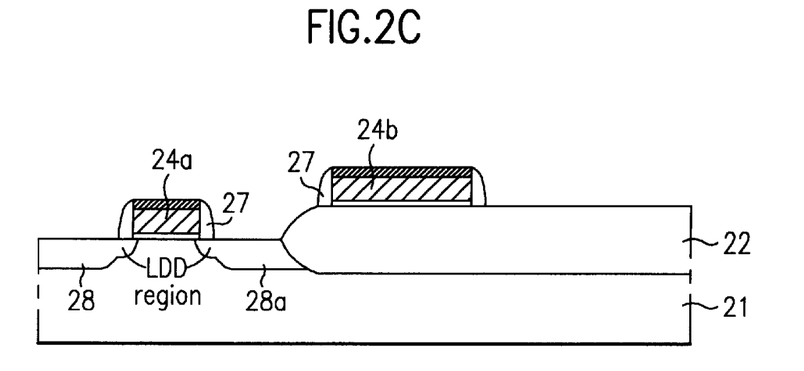

Referring to FIG. 2c, lightly doped impurity ions are implanted into the semiconductor substrate 21 to form LDD regions under the surface of the semiconductor substrate 21 at both sides of the gate electrode 24a. Next, a second insulating layer is formed on the entire surface of the semiconductor substrate 21 including the gate electrode 24a and the lower electrode 24b of the capacitor, and then is etched-back to form sidewall spacers 27 on both sides of each of the gate electrode 24a and the lower electrode 24b of the capacitor. Thereafter, heavily doped impurity ions are implanted to form source and drain impurity regions 28 and 28a under the surface of the semiconductor substrate 21 at both sides of the gate electrode 24a.

Figure 2D:
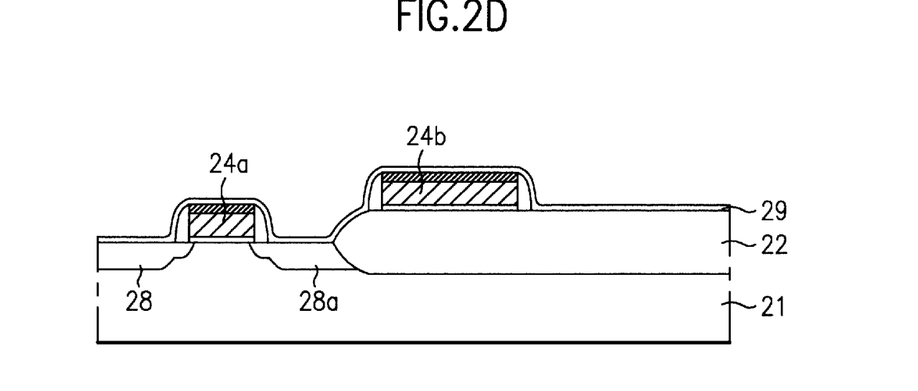

Referring to FIG. 2d, a dielectric layer 29 of a capacitor is formed on the entire surface of the semiconductor substrate 21 including the gate electrode 24a and the lower electrode 24b of the capacitor.

Figure 2E:
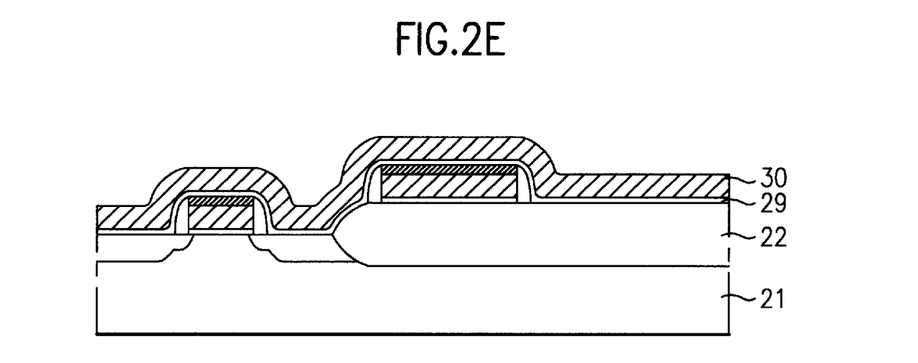

Referring to FIG. 2e, a second polysilicon layer 30 used as an upper electrode of a capacitor is formed on the dielectric layer 29 of the capacitor.

Figure 2F:
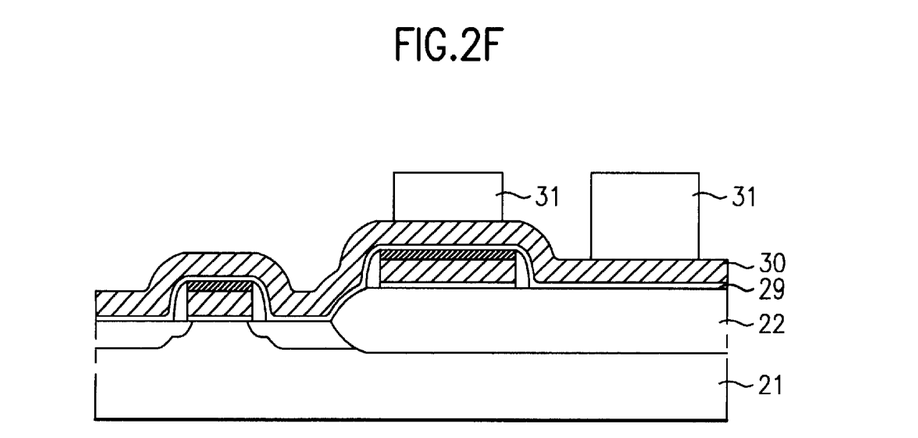

Referring to FIG. 2f, a second photo resist film 31 is coated on the second polysilicon layer 30 and patterned by an exposure and development process.

Figure 2G:
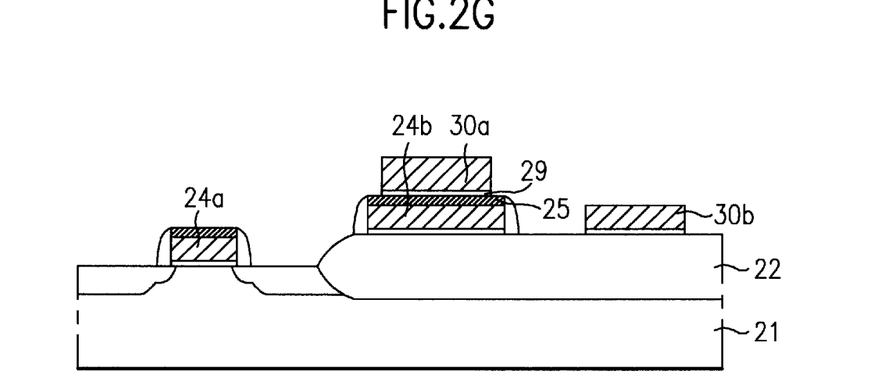

Referring to FIG. 2g, using the second photo resist pattern 31 as a mask, the second polysilicon layer 30 and the dielectric layer 29 of the capacitor are successively removed with an etching process to form an upper electrode 30a of the capacitor and a resistor pattern 30b, so that the surface of the field oxide layer 22 and the semiconductor substrate 21 at both sides of the gate electrode 24a are exposed.

Figure 2H:
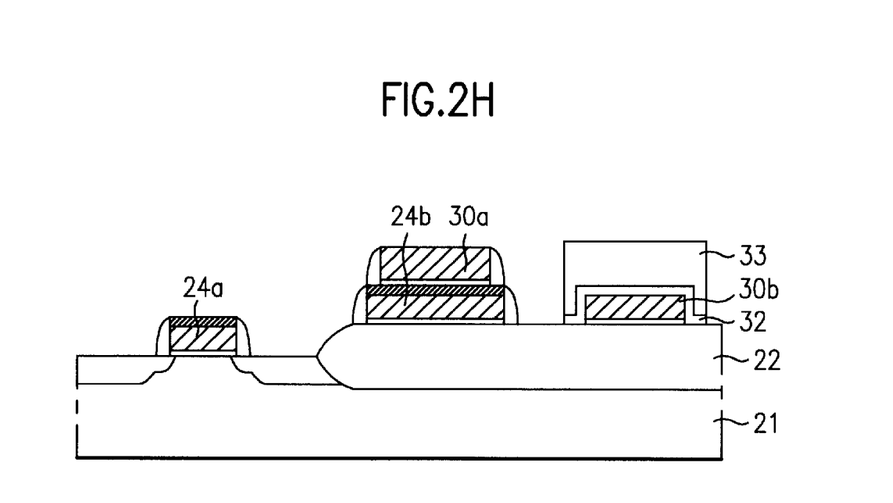

Referring to FIG. 2h, a third insulating layer 32 is formed on the entire surface including the upper electrode 30a and the resistor pattern 30b. Next, a third photo resist film 33 is coated on the entire surface of the third insulating layer 32 and then patterned by an exposure and development process to have a wider width than that of the resistor pattern 30b. At this time, the third insulating layer 32 is used as a high-temperature low-pressure dielectric (HLD) layer. Subsequently, using the third photo resist pattern 33 as a mask, the third insulating layer 32 is etched-back to form second sidewall spacers on both sides of the upper electrode 30b of the capacitor.

Figure 2I:
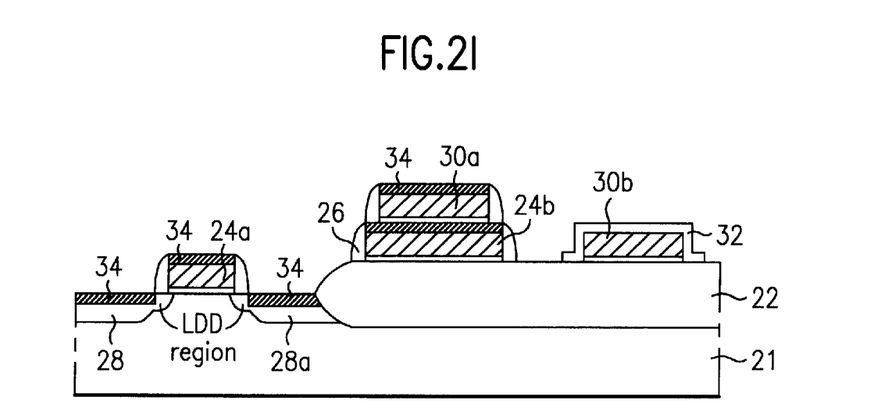

Referring to FIG. 2i, the remaining third photo resist film 33 is removed and then a metal such as titanium (Ti) is deposited on the entire surface. Accordingly, a polycide layer 34 is formed on the gate electrode 24a, on the semiconductor substrate 21 at both sides of the gate electrode 24a, and on the upper electrode 30a of the capacitor by a self-alignment process. On the resistor pattern 30b, there is not formed a polycide layer 34 because the third insulating layer 32 protects the resistor pattern 30b.

According to the first embodiment described above, a polycide layer is formed on the surface of the gate electrode 24a, on the semiconductor substrate 21 of the source and drain impurity regions 28 and 28a, and on the surface of the upper electrode 30a.

FIGS. 3a to 3i are cross-sectional views showing process steps of a method for fabricating a semiconductor device according to the second embodiment of the invention.

Figure 3A:
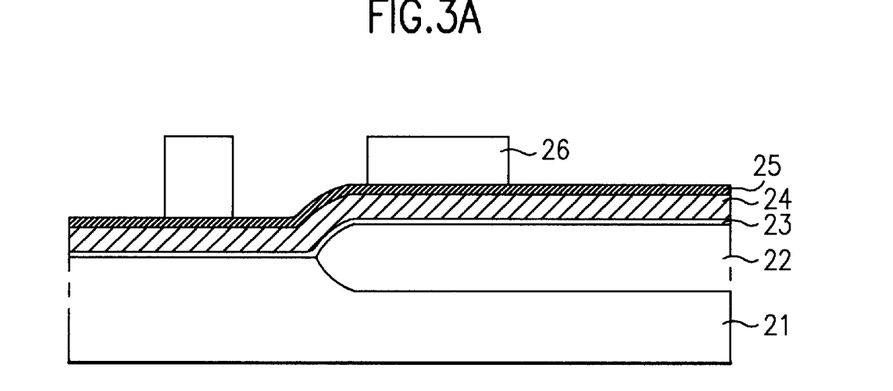
FIGS. 3a to 3i are cross-sectional views showing process steps of a method for fabricating a semiconductor device according to a second embodiment of the invention.

Referring initially to FIG. 3a, a field oxide layer 22 is formed on a predetermined area of a semiconductor substrate 21 to define an active region. Subsequently, on the entire surface of the semiconductor substrate 21 including the field oxide layer 21, there is formed a first insulating layer 23, upon which a polysilicon layer 24 is then formed. At this time, the first insulating layer 23 is used as a gate insulating layer. A metal is deposited on the first polysilicon layer 24 and then annealed to form a polycide layer 25 at interface of the first polysilicon layer 24 and the metal. Next, a first photo resist film 26 is coated on the polycide layer 25 and patterned by an exposure and development process.

Figure 3B:
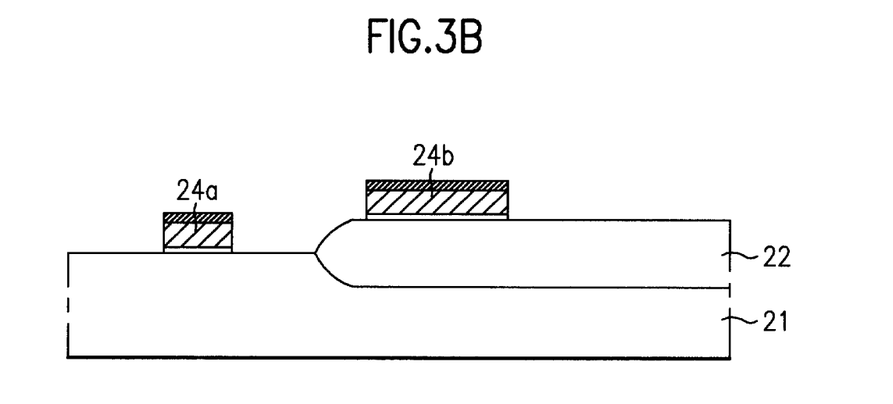

Referring to FIG. 3b, using the photo resist pattern 26 as a mask, the polycide layer 25, the first polysilicon layer 24, and the first insulating layer 23 are selectively removed by an etching process so that there are formed a gate electrode 24a made of a polycide layer on the semiconductor substrate 21 and a lower electrode 24b made of a polycide layer on a predetermined area of the field oxide layer 22.

Figure 3C:
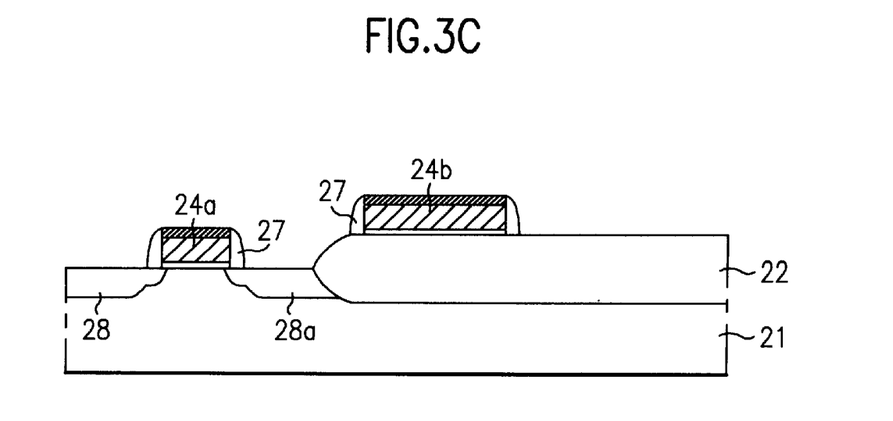

Referring to FIG. 3c, lightly doped impurity ions are implanted to form LDD regions under the surface of the semiconductor substrate 21 at both sides of the gate electrode 24a. A second insulating layer is formed on the entire surface of the semiconductor substrate 21 including the lower electrode 24b and the gate electrode 24a and then etched-back to form first sidewall spacers 27 at both sides of each of the gate electrode 24a and the lower electrode 24b of the capacitor. Heavily doped impurity ions are implanted to form source and drain impurity regions 28 and 28a under the surface of the semiconductor substrate 21 at both sides of the gate electrode 24a.

Figure 3D:
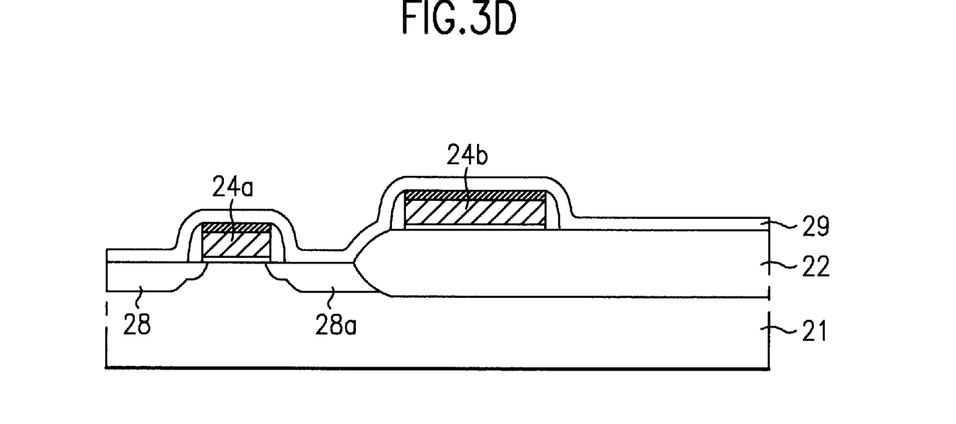

Referring to FIG. 3d, a dielectric layer 29 of the capacitor is formed on the entire surface of the semiconductor substrate 21 including the gate electrode 24a and the lower electrode 24b of the capacitor.

Figure 3E:
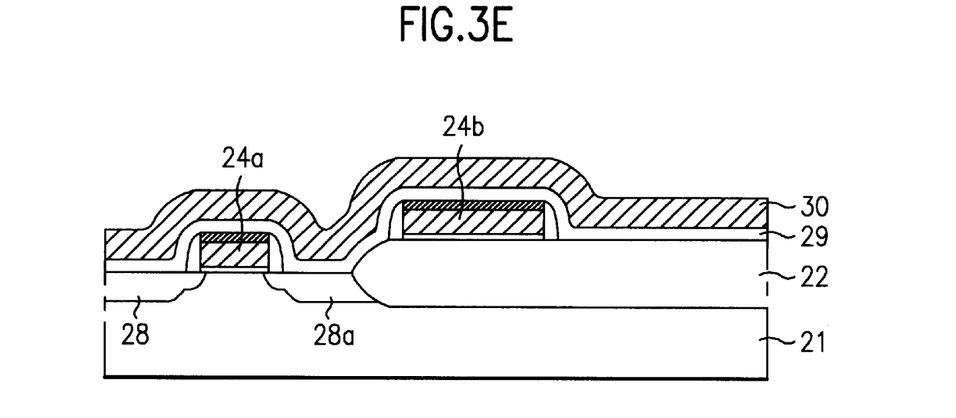

Referring to FIG. 3e, on the dielectric layer 29, there is formed a second polysilicon layer 30 used as an upper electrode of the capacitor.

Figure 3F:
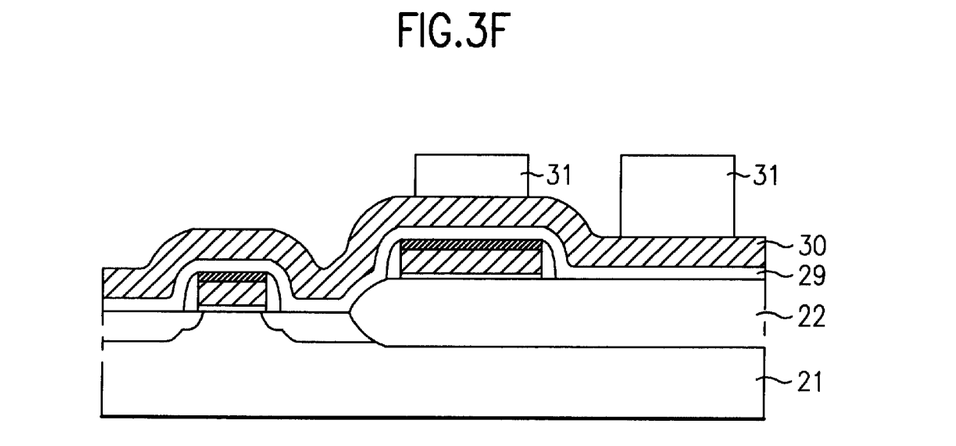

Referring to FIG. 3f, a second photo resist film 31 is coated on the second polysilicon layer 30 and then patterned by an exposure and development process.

The process steps, so far, are identical with those according to the first embodiment of the invention.

Figure 3G:
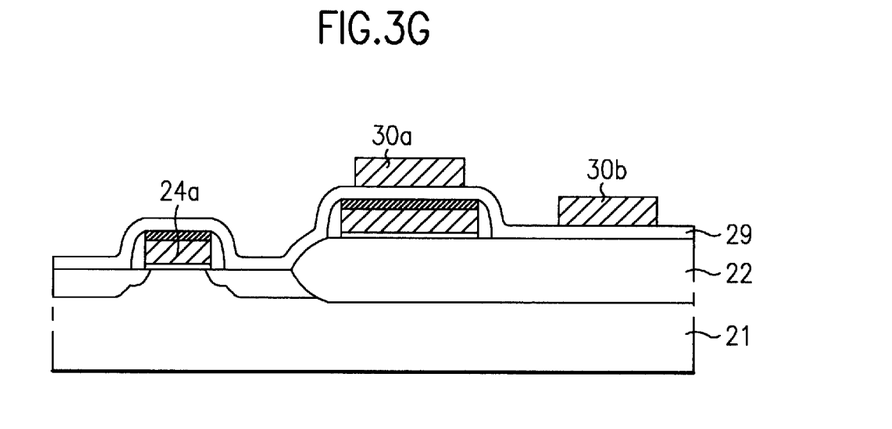

Referring to FIG. 3g, using the second photo resist pattern 31 as a mask, the second polysilicon layer 30 is selectively removed by an etching process to form an upper electrode 30a and a resistor pattern 30b.

Figure 3H:
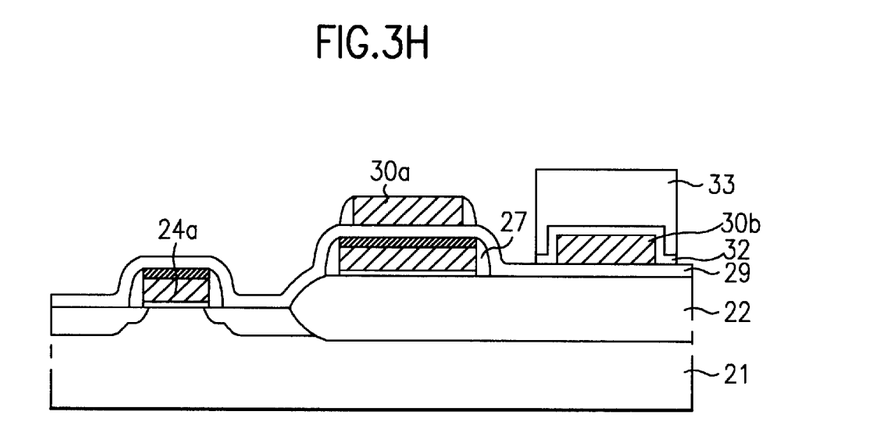

Referring to FIG. 3h, a third insulating layer 32 is formed on the entire surface including the resistor pattern 30b. Subsequently, a third photo resist film 33 is coated on the entire surface including the third insulating layer 32 and then patterned by an exposure and development process to have a wider width than that of the resistor pattern 30b. Using the third photo resist pattern 33 as a mask, the third insulating layer 32 is etched-back to form second sidewall spacers on both sides of the upper electrode 30a of the capacitor. At this time, the third insulating layer 32 is not removed on the resistor pattern 30b.

Figure 3I:
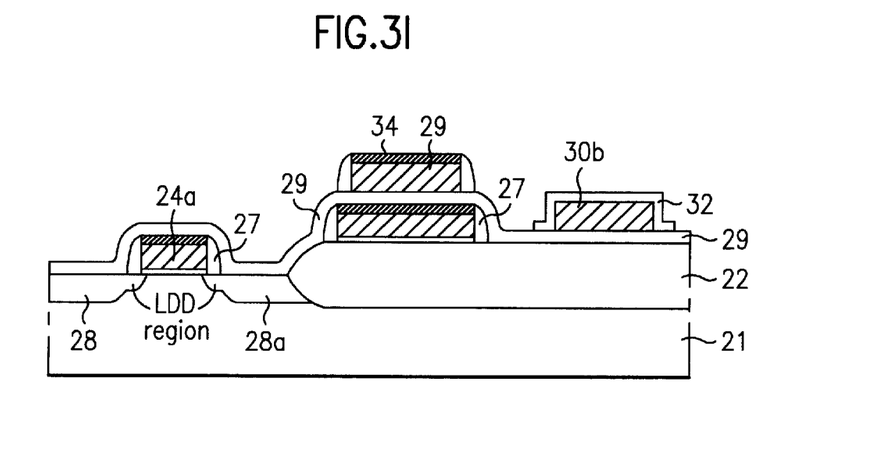

Referring to FIG. 3i, the remaining photo resist film 33 is removed and then a metal is deposited on the entire surface. In this case, the metal is made of any one of titanium, cobalt, or tungsten. An annealing process is performed to the metal to form a polycide layer 34 on the surface of the upper electrode 30a of the capacitor. At this time, since the third insulating layer 32 protects the resistor pattern 30b, a polycide layer 34 is not formed on the resistor pattern 30b. Since the dielectric layer 29 protects the gate electrode 24a and the semiconductor substrate 21 at both sides of the gate electrode 24a, a polycide layer is not formed on the gate electrode 24a and on the semiconductor substrate at both sides of the gate electrode 24a.

According to the second embodiment of the invention, the gate electrode of a MOSFET, and lower and upper electrodes of a capacitor are formed of polycide, and the resistor pattern is formed of polysilicon.

The method for fabricating a semiconductor device of the invention has the following advantages.

First, since a resistor pattern which functions as a resistor is formed of polysilicon and electrodes of a capacitor are formed of polycide, the resistance of the resistor pattern is increased and the resistance of the electrodes is minimized to obtain a high speed analog integrated circuit.

Second, since a self-alignment process is used to form polycide, the overall process is simplified. Also, a MOSFET and electrodes of a capacitor are formed of polycide and the resistor is formed of polysilicon so that performance of the device is advanced, thereby obtaining an analog integrated circuit with good performance without signal delay and power loss It will be apparent to those skilled in the art that various modification and variations can be made in the method for fabricating a semiconductor device of the present invention without departing from the spirit or scope of the inventions. Thus, it is intended that the present invention cover the modifications and variations of this invention provided they come within the scope of the appended claims and their equivalents.

What is claimed is:

1. A method for fabricating a semiconductor device on a semiconductor substrate, the method comprising the steps of:

forming a field oxide layer on a field region of the semiconductor substrate;

forming a first polycide layer on the entire surface of the semiconductor substrate including the field oxide layer;

selectively removing the first polycide layer, thereby forming a gate electrode and a lower electrode of a capacitor;

successively forming a dielectric layer and a polysilicon layer on the entire surface including the lower electrode of the capacitor and patterning the dielectric layer and the lower electrode to form an upper electrode pattern of the capacitor and a resistor pattern; and forming an insulating layer on the resistor pattern;

forming a second polycide layer on the upper electrode pattern of the capacitor.

2. The method as claimed in claim 1, wherein the process step of forming the lower electrode of the capacitor and the gate electrode comprises the steps of:

forming a polysilicon layer and a metal layer on the entire surface of the semiconductor substrate including the field oxide layer;

forming the polycide layer at interface of the polysilicon layer and the metal layer by an annealing process; and selectively etching the polysilicon layer and the polycide layer by using pattern masks for the lower electrode of the capacitor and the gate electrode so as to form the lower electrode of the capacitor on a predetermined area of the field oxide layer and the gate electrode on the semiconductor substrate of the active region.

3. The method as claimed in claim 2, wherein said metal layer is formed of any one of titanium, cobalt, or tungsten.

4. A method for fabricating a semiconductor device on a semiconductor substrate, the method comprising the steps of:

forming a field oxide layer on the semiconductor substrate;

forming a first polysilicon layer and a first metal layer on the entire surface including the field oxide layer so as to form a first polycide layer on the first polysilicon layer by an annealing process;

selectively etching the first polysilicon layer and the polycide layer to form a gate electrode and a lower electrode of a capacitor;

forming a dielectric layer and a second polysilicon layer on the entire surface including the lower electrode of the capacitor and then successively removing the dielectric layer and the second polysilicon layer to form an upper electrode pattern of the capacitor and a resistor pattern;

forming an insulating layer to cover the resistor pattern and forming sidewall spacers on both sides of the upper electrode pattern of the capacitor; and forming a second metal layer on the entire surface including the upper electrode pattern of the capacitor so as to form a second polycide layer on the semiconductor substrate at both sides of the gate electrode and on the upper electrode pattern of the capacitor by an annealing process.

5. The method as claimed in claim 4, wherein said polycide layer formed on the semiconductor substrate at both sides of the gate electrode is used as source and drain electrodes.

6. The method as claimed in claim 4, wherein an self-alignment process is applied to form the polycide layer on the semiconductor substrate at both sides of the gate electrode and on the upper electrode of the capacitor.

7. The method as claimed in claim 4, wherein said first and second metal layers are formed of any one of titanium, tungsten, or cobalt.

8. The method as claimed in claim 4, wherein said insulating layer is a high-temperature low-pressure dielectric layer.

9. The method as claimed in claim 4, wherein each of the metal layers where the polycide layer is not formed is removed after the annealing process.

10. The method as claimed in claim 4, after forming the gate electrode, further comprising the steps of:

implanting lightly doped impurity ions into the semiconductor substrate at both sides of the gate electrode by using the gate electrode as a mask, so as to form LDD regions; and forming sidewall spacers on both sides of the gate electrode and then implanting heavily doped impurity ions to form source and drain impurity ions under surface of the semiconductor substrate at both sides of the gate electrode.

11. The method as claimed in claim 8, wherein said insulating layer serves to prevent the polycide from being formed.

12. A method for fabricating a semiconductor device on a semiconductor substrate, the method comprising the steps of:

forming a field oxide layer on the semiconductor substrate;

forming a first polysilicon layer and a first metal layer on the entire surface including the field oxide layer so as to form a first polycide layer on surface of the first polysilicon layer by an annealing process;

selectively removing the first polysilicon layer and the polycide layer to form a gate electrode and a lower electrode of a capacitor;

successively forming a dielectric layer and a second polysilicon layer on the entire surface including the lower electrode of the capacitor and then selectively removing the second polysilicon layer to form an upper electrode pattern of the capacitor and a resistor pattern;

forming an insulating layer to cover the resistor pattern so as to form sidewall spacers on both sides of the upper electrode pattern of the capacitor; and depositing and then annealing a second metal on the entire surface including the upper electrode pattern of the capacitor so as to form a second polycide layer on surface of the upper electrode pattern of the capacitor.

13. The method as claimed in claim 12, wherein the polycide layer is not formed on the semiconductor substrate at both sides of the gate electrode because of the dielectric layer.

14. The method as claimed in claim 12, after forming the gate electrode, further comprising the steps of:

implanting lightly doped impurity ions into the semiconductor substrate at both sides of the gate electrode by using the gate electrode as a mask, so as to form LDD regions; and forming sidewall spacers on both sides of the gate electrode and then implanting heavily doped impurity ions to form source and drain electrodes under surface of the semiconductor substrate at both sides of the gate electrode.

15. The method as claimed in claim 12, wherein the dielectric layer prevents the polycide layer from being formed on the gate electrode and on the semiconductor substrate at both sides of the gate electrode under the dielectric layer, and the insulating layer prevents the polycide layer from being formed on the polysilicon layer under the insulating layer.

* * * * *